US012750989B2

(12) United States Patent
Kocherscheid et al.

(10) Patent No.: US 12,750,989 B2
(45) Date of Patent: Sep. 29, 2026

(54) ELECTRIC DRIVE SYSTEM OF A MOTOR VEHICLE AND METHOD FOR CONTROLLING THE TEMPERATURE OF DRIVE SYSTEM COMPONENTS OF SUCH AN ELECTRIC DRIVE SYSTEM

(71) Applicant: Volkswagen Aktiengesellschaft, Wolfsburg (DE)

(72) Inventors: Leon Kocherscheid, Wolfsburg (DE); Johannes Bunkus, Hoetensleben OT Barneberg (DE)

(73) Assignee: Volkswagen Aktiengesellschaft, Wolfsburg (DE)

( * ) Notice: Subject to any disclaimer, the term of this patent is extended or adjusted under 35 U.S.C. 154(b) by 330 days.

(21) Appl. No.: 18/584,579

(22) Filed: Feb. 22, 2024

(65) Prior Publication Data

US 2024/0284646 A1 Aug. 22, 2024

(30) Foreign Application Priority Data

Feb. 22, 2023 (DE) ..................... 10 2023 201 549.8

(51) Int. Cl.
*H05K 7/20* (2006.01)

(52) U.S. Cl.
CPC ..... *H05K 7/20945* (2013.01); *H05K 7/20845* (2013.01)

(58) Field of Classification Search
CPC .. H05K 7/20945; H05K 7/20845; B60K 1/00; B60K 11/02; B60K 2001/003; B60K 2001/008; B60L 58/24; B60L 58/26; B60L 58/27
See application file for complete search history.

(56) References Cited

U.S. PATENT DOCUMENTS

| | | | |
|---|---|---|---|
| 2011/0296855 A1 | 12/2011 | Johnston et al. | |
| 2014/0129063 A1 | 5/2014 | Clark et al. | |
| 2022/0274458 A1 | 9/2022 | Eser et al. | |

FOREIGN PATENT DOCUMENTS

| | | | |
|---|---|---|---|
| DE | 102010017392 A1 | 12/2011 | |
| DE | 102011014683 A1 * | 9/2012 | ............... B60K 1/00 |
| DE | 102013222192 A1 | 5/2014 | |

(Continued)

OTHER PUBLICATIONS

English Translation of “DE-102011014683-A1” (Year: 2012).*

*Primary Examiner* — Charles R Kasenge
(74) *Attorney, Agent, or Firm* — Muncy, Geissler, Olds & Lowe, P.C.

(57) ABSTRACT

An electric drive system of a motor vehicle and method for controlling the temperature of components of such an electric drive system, of a motor vehicle which has at least an electrical energy storage system, at least one power electronics unit, and at least one electrical machine for driving at least one drive wheel of the motor vehicle. The electrical energy storage system, the power electronics and the electrical machine each constitute a drive system component of the drive system and are functionally coupled with each other. At least two of the drive system components are part of an optimization module, which is designed to perform a performance-optimized relative temperature control of the drive system components. The invention also relates to a method of controlling the temperature of drive system components of such an electric drive system.

9 Claims, 2 Drawing Sheets

(56) References Cited

FOREIGN PATENT DOCUMENTS

| | | | |
|---|---|---|---|
| DE | 102019210577 | A1 | 1/2021 |
| EP | 3088230 | A1 | 11/2016 |
| FR | 3095993 | A1 | 11/2020 |

* cited by examiner

ELECTRIC DRIVE SYSTEM OF A MOTOR VEHICLE AND METHOD FOR CONTROLLING THE TEMPERATURE OF DRIVE SYSTEM COMPONENTS OF SUCH AN ELECTRIC DRIVE SYSTEM

This nonprovisional application claims priority under 35 U.S.C. § 119(a) to German Patent Application No. 10 2023 201 549.8, which was filed in Germany on Feb. 2, 2023, and which is herein incorporated by reference.

BACKGROUND OF THE INVENTION

Field of the Invention

The invention relates to an electric drive system of a motor vehicle and to a method for controlling a temperature of drive system components of such an electric drive system.

Description of the Background Art

From DE 10 2010 017 392 A1, a method for activating an extended electric operation of a motor vehicle, a control device for controlling the method as well as a switching device for activating the method are known. Reference is made exclusively to the preconditioning of a traction battery of an electrically powered motor vehicle which should only be carried out when a control element has been activated by the driver of the motor vehicle. Preconditioning should be effected by means of an on-demand increase or decrease in the temperature of the traction battery. Neither an electrical machine nor power electronics of an electric drive system are referenced in the document.

From DE 10 2013 222 192 A1, which corresponds to US 2014/0129063, a method for controlling the temperature of an energy storage system of an electric vehicle is known, according to which vehicle operating conditions over time are monitored, historical vehicle operating trends are calculated from the monitored vehicle operating conditions and a standard thermal conditioning temperature setpoint for the energy storage system is adjusted in order to define an adjusted thermal conditioning temperature setpoint. The standard thermal conditioning temperature setpoint is adjusted on the basis of the calculated historical vehicle operating trend to improve the performance of the energy storage system for the historical vehicle operating trends. The energy storage system is to be heated and/or cooled to align an actual temperature of the energy storage system with the adjusted thermal conditioning temperature setpoint. Electrical machines and power electronics of electric drives are not referenced in the document.

From practice, various temperature control options for components of electrical drive systems are known. Frequently encountered are coolers that are either arranged exclusively interacting with electrical energy storage systems, or coolers that are arranged interacting with electrical energy storage systems and other drive system components by being connected in series and, for example, serially flowed through by a temperature control fluid (especially cooling fluid). The disadvantage of this design is that one or more drive system components in certain operating conditions are not or no longer sufficient or cannot be tempered as required. This can lead to operating conditions in which the electric drive system can only deliver a reduced amount of power.

SUMMARY OF THE INVENTION

It is therefore an object of the invention to provide an electric drive system of a motor vehicle as well as a method for controlling the temperature of drive system components of such an electric drive system with which the power output of the drive system can be increased.

An electric drive system of a motor vehicle according to the invention can have at least one electrical energy storage system, at least one power electronics and at least one electrical machine for driving at least one drive wheel of the motor vehicle, wherein the electrical energy storage system, the power electronics and the electrical machine in each case constitute a drive system component of the drive system and are functionally interconnected with each other. In particular, the functional coupling is carried out in such a way that the electrical energy storage system provides drive power to the electrical machine, and the power electronics is used for the control of the electric drive power to the electrical machine, in particular in that control commands from a driver, with respect to the desired drive of a motor vehicle in the form of drive power from the electrical machine, are provided with the help of the electrical energy storage system. In this context, in the drive system according to the invention, at least two of the drive system components are part of an optimization module, which is designed to carry out performance-optimized relative temperature control of the drive system components. Performance-optimized relative temperature control is to be understood, in particular, as temperature control that takes into account which of the components that are part of the optimization module can currently deliver the lowest temperature-dependent power, in order to be able to increase the maximum power of the drive system that can be dissipated as quickly as possible by prioritizing the temperature control of this component.

An electrical energy storage system within the meaning of the invention is in particular a drive power storage system, which in practice is also generally known as a battery. This is a large number of battery cells that are interconnected to create a battery storage system or several battery modules. If there are more than one battery modules, they are usually interconnected to form a battery. In practice, the batteries are, in particular, high-voltage batteries. The voltage of such high-voltage batteries is usually at least 48 V, usually at least 100 V and preferably at 100 V to 1,200 V, especially preferably at 200 V to 800 V.

For further details of the optimization module, reference is made to the method according to the invention, which will be discussed later. The optimization module is preferably designed to carry out the method according to the invention in order to control the temperature of the components, which are part of the optimization module, in a performance-optimized manner.

The principle of the invention is based on the following approach:

$$P_{max,System} = \min(P_{Peak,EE\cdot}(T_{EE}), P_{Peak,LE}(T_{LE}), P_{peak,EM}(T_{EM}))$$

In words, this means that the maximum system performance is equal to the minimum of the currently available temperature-dependent peak power of the electrical energy storage system (EE), the currently available temperature-dependent peak power of the power electronics (LE) and the currently available temperature-dependent peak power of the electrical machine (EM). With the help of the optimization module, regular or irregular intervals checks are carried out to determine which peak power is currently the lowest and how it can be increased by increasing or decreasing the temperature. Depending on this check, the relative temperature control is then optimized for performance, i.e., in such a way that, with the existing means of influencing the temperature, the maximum power $P_{max,System}$ is always achieved.

In a practical example of an electric drive system, the optimization module can contain at least two temperature detection units and at least one switching device coupled to a temperature control device in order to be able to operate the switching unit as needed depending on actual temperature values recorded by the temperature detection units. Temperature detection units include, in particular, temperature sensors, thermostats with integrated temperature sensors or functional connections to the ECUs of a motor vehicle, which provide appropriate temperature values. These temperatures are, in particular, the tempering medium temperatures of tempering mediums in the range of a point where it flows in the area of a component, so that conclusions can be drawn from the tempering medium temperature about the temperature of the respective component. This can also be done using empirical results, simulation calculations or other values which were previously determined and provided.

If, in an electric drive system, at least for each type of drive system component, a separately controllable temperature control device limited or limitable to this drive system component is provided, only one drive system component may be tempered if necessary, e.g., by increasing or decreasing the respective temperature of the drive component. This can be achieved by means of separate temperature control devices and separate tempering medium circuits or by a suitable structure with switching devices that enable the on-demand activation and deactivation of flow paths through individual drive components.

In another practical example of an electric drive system, which can be combined with the latter case, in particular at least two drive system components are functionally coupled with a common temperature control device. Such a system has the advantage that only one temperature control device can be used for two or more drive system components, such as a cooler, in particular in the form of a heat exchanger or heater. The disadvantage of this system, however, is that to deactivate one or more drive components appropriate measures must be provided, in particular additional fluid paths or fluid branches, which can be opened and closed as needed or which need to at least be controllable in such a way with regard to the flow rate that the flow can be increased or reduced through certain fluid paths.

In conjunction with an electric drive system in which at least two drive system components are serially connected to each other, it is preferred to have the option of controlling the temperature of only one of the drive components. Such an option is to provide at least one bypass for a drive system component which, by means of a switching device, can be brought as needed at least into an open configuration (flow only through the drive system component) or into a closed configuration (flow only through the bypass and not the drive system component). It is also possible to install a control flap or any other fluidal actuator which makes it possible to enable the flow evenly through the bypass and the associated drive system component, or to distribute the flow variably between the bypass and the drive system component, e.g., ⅓ through the bypass and ⅔ through the associated drive system component.

In another practical example of an electric drive system, at least one active cooler and/or at least one active heater are provided. Preferably, at least one active cooler is provided in order to cool the drive system components as needed and thus maximize the power that can be delivered in compliance with a certain temperature window, or to ensure that said power is as high as possible under the given framework conditions. If, in addition, there is also an active heater, in particular at outside temperatures of less than 20° C., less than 10° C. or less than 0° C., a drive system component can also be brought within a temperature range as soon as possible, in which a high peak power can be delivered immediately after a cold start phase of a vehicle. An active cooler in particular includes a heat exchanger and/or an air conditioning unit. In particular, an active heater is defined as a heater with at least one PTC heating element and/or with a heat pump.

Alternatively, or in addition to, an active heater or an active cooler, an additional tempering medium or several additional tempering mediums can also be provided. In particular, this refers to switchable and/or functionally connectable tempering mediums which can be used for additional direct or indirect heating or cooling of tempering mediums. In this context, particular reference is made to the possibility of using the coolant from a different coolant circuit in order to provide additional cooling. This can be achieved by indirect use through on-demand operation of a heat exchanger or by direct use through on-demand intake or discharge of coolant into a temperature control circuit.

The invention also relates to a method for controlling the temperature of at least two of the drive system components of electrical energy storage system, power electronics and electrical machine for driving at least one drive wheel of the motor vehicle, which are part of an optimization module of an electric drive system of a motor vehicle, wherein at least the following method steps are provided: (a) determining the current output of the drive system components depending on the current component temperature, (b) Comparing the current deliverable power of the at least two drive system, (c) components to determine which drive system component provides the least power, (d) Temperature control of the drive system component determined in step b) and continuous or discontinuous continuation with step (a).

With the help of the method according to the invention, the deliverable power of an electrical drive system can be maximized, thereby increasing the efficiency of an electrically driven motor vehicle.

If, in a method of the invention, instead of step b) it is checked whether a drive system component or several drive system components, due to temperature, currently can only deliver a power below a predefined limit value and, if so, tempering all such drive system components, the result is a very simple control system that is purely temperature-dependent and independent of other framework conditions.

Alternatively, such a check can also be carried out before step b). In this case, step b) is carried out as soon as no drive component exceeds the specified limit value, resulting in a cascading, two-step approach.

In another, somewhat more complex example of the method according to the invention, in the optimization module, a map with operating points and associated control commands is stored in order to create a relative temperature control of the drive system caused by predefined control commands dependent on determined operating points. Although this method requires a thorough identification and design of a characteristic map, it has the advantage that it is also possible to consider other aspects in the map, such as the knowledge of whether a longer journey is obviously planned, for example because the navigation system has been used or the recognition by a time and an initial route profile that a specific destination is being targeted. In this case, the temperature control takes into account that a certain minimum travel time is expected to be reached.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
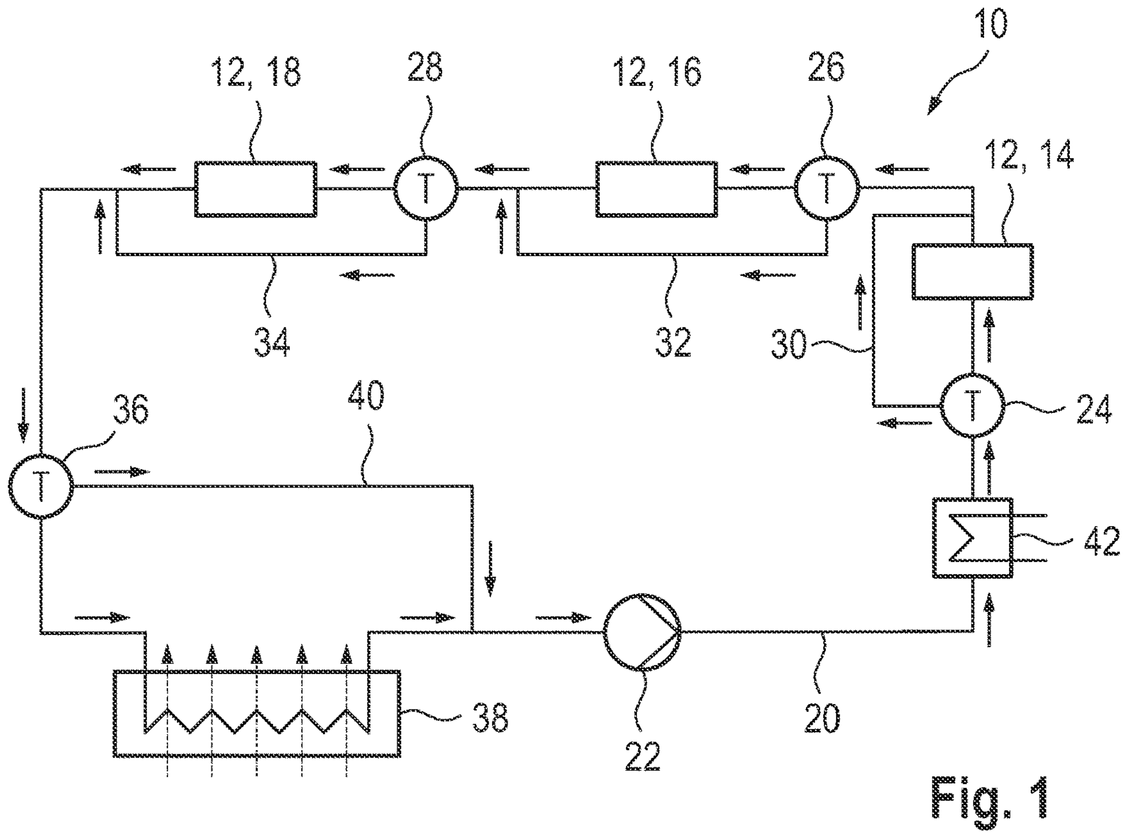
FIG. 1 shows a circuit diagram of an electric drive system according to the invention with three series-connected drive power components.

FIG. 1 shows a circuit diagram of an electric drive system 10 according to the invention. The electric drive system 10 comprises, as drive system components 12, an electrical energy storage system 14, a power electronics 16 and an electrical machine 18. The drive system components 12 are connected in series in the example shown, i.e., arranged serially. This means that all drive system components 12 are connected in series and are part of a common tempering medium circuit 20. The tempering medium circuit 20 is permeated by a tempering medium, in particular a coolant. The tempering medium is conveyed and driven by a tempering medium pump 22. The tempering medium pump 22 can be, in particular, an electric coolant pump.

In the example shown, an energy storage thermostat 24 is arranged in front of the electrical energy storage system 14, a power electronics thermostat 26 in front of the power electronics 16 and a machine thermostat 28 in front of the electrical machine 18. With the help of the respective thermostat 24, 26, 28, the tempering medium can be adjusted, fully or partially, as required, by means of an energy storage bypass 30, a power electronics bypass 32 or a machine bypass 34, which bypasses the respective element and thus—depending on the switching position of the thermostat 24, 26, 28—in the case of full flow, does not supply nor extract any temperature at all to or from the respective element and, in the case of partial flow, only partially extracts or supplies temperature. Temperature is supplied to the respective element when the tempering medium has a higher temperature than the respective element. Temperature is extracted when the tempering medium has a lower temperature than the respective element. In this case, the tempering medium is a coolant.

Downstream of the electrical machine 18, another temperature control device thermostat 36 is connected upstream of a temperature control device 38. For this temperature control device 38, a temperature control device bypass 40 is also provided. This temperature control device 38 can be a cooler and/or a heater. These can also be two or more separate temperature control devices 38 at different points in the tempering medium circuit 20.

The temperature control device bypass 40 is only flowed through when the temperature control device 38 is not required; in particular if the flow resistance through the temperature control device 38 is greater than that through the temperature control device bypass 40, then the flow resistance is reduced or the flow velocity is increased.

Upstream in front of the electrical energy storage system 14, which in the present case is a high-voltage battery of an electrically powered motor vehicle, an optional heat exchanger 42 is provided for air conditioning. For this heat exchanger 42, too, optionally a heat exchanger bypass can be provided.

Due to the fact that in the example shown a separate bypass 30, 32, 34 is provided for each of the drive system components 12, an increase in temperature or a reduction in temperature, i.e., a relative temperature control, can be carried out in a targeted manner only on a selected drive system component 12 or on two selected drive system components 12 by fully opening the bypass of the drive system component 12 not to be tempered and fully closing the duct section through this drive system component 12.

In particular, the energy storage thermostat 24, the power electronics thermostat 26 and the machine thermostat 28 are preferably electrically controlled thermostats. To determine a performance-optimized control of these thermostats 24, 26, 28, e.g., by means of thermostat maps, in particular simulation calculations, measurement series on component test benches and/or measurement series in prototype vehicles are performed.

Figure 2:
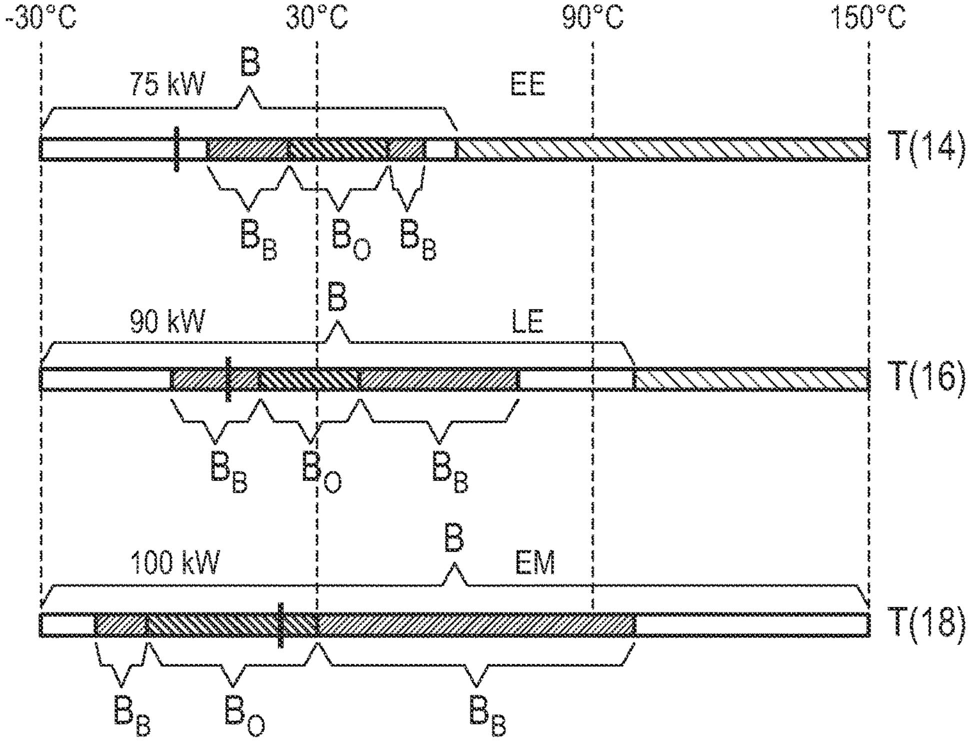
FIG. 2 is an example of a less preferred relative temperature control of the drive system components of the electric drive system shown in FIG. 1.
Figure 3:
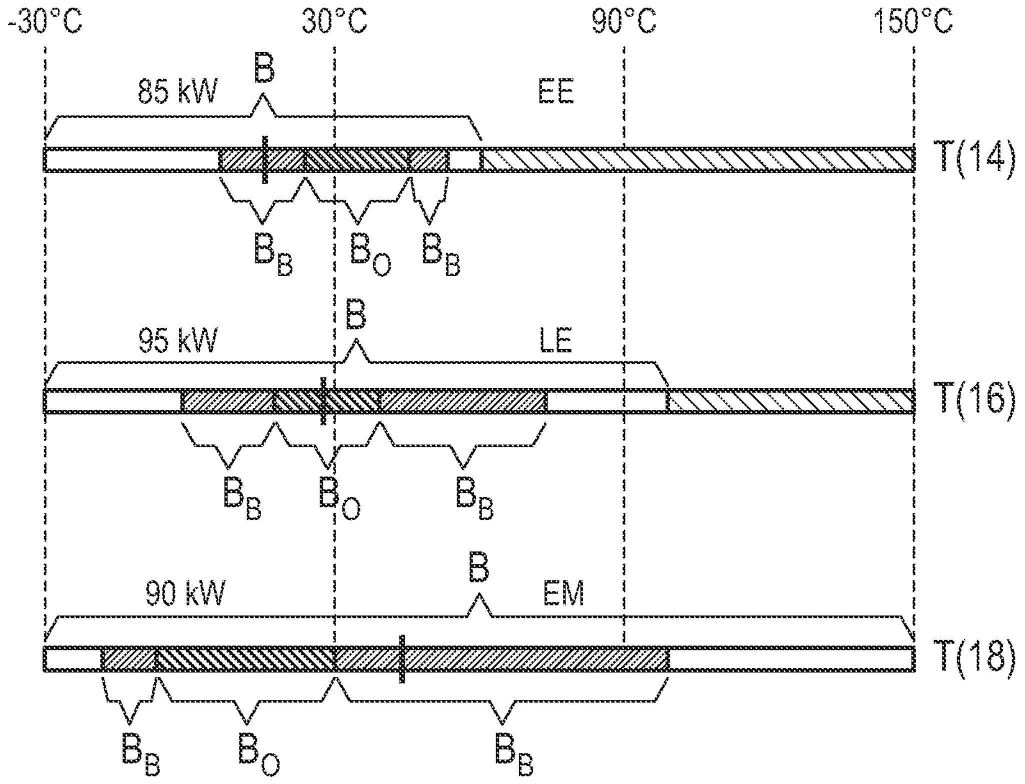
FIG. 3 is an example of a preferred relative temperature control of the drive system components of the electric drive system shown in FIG. 1, in accordance with the method according to the invention.

In particular, this can be methodically implemented as follows:

(a) Establishment of a cooling circuit with the option of optimizing the temperature control in the system b) Transfer of the designed cooling circuit to a simulation environment c) Determination of ideal thermostat maps by means of test series:

i. $x_{EM}$ . . . Thermostat setting EM (0% . . . 100%), $x_{LE}$ . . . Thermostat setting LE (0% . . . 100%), $x_{EE}$ . . . Thermostat setting of electrical energy storage systems, in particular HV battery (0% . . . 100%)

ii. Thermostat settings are dependent on ambient temperature and component temperature ($x=f(T_{umg}, T_{EM}, T_{LE}, T_{EE})$)

iii. Optimization of the thermostat setting, e.g., PSO, so that, taking into account the known boundary conditions (max. thermostat settings, optimal temperature ranges, min./max. component temperatures, etc.), the maximum possible system performance is available:

$\Rightarrow x_{opt}=f(T_{umg}, T_{EM}, T_{LE}, T_{EE})$, so that $P_{system}(T_{EM}, T_{LE}, T_{EE})$ is at a maximum d) Transfer of the determined characteristic maps to the control unit, taking into account application boundary conditions e) Testing/validation of maps from simulation to component test bench f) If necessary, adaptation of the maps, taking into account boundary conditions not known in simulation or not described in sufficient detail g) Application of the determined maps to the control unit for the prototype vehicle (h) Testing/validation of the maps by means of a series of tests in the real vehicle i) If necessary, adaptation of the characteristic maps, taking into account real boundary conditions In particular, the tempering medium circuit shown in FIG. 1 can be used to perform the relative temperature controls visualized in FIG. 2. and FIG. 3, wherein FIG. 2 shows a relative temperature control primarily directed at the electrical machine 18, whereas FIG. 3 refers to the implementation of the method according to the invention.

In both FIG. 2 and FIG. 3, in each case the entire operating range B of each drive system component 12 as well as preferred temperature ranges BB and an optimal temperature range $B_O$ are shown. These are related to the drive system components 12—identical in both examples—and therefore congruent for the respective drive system components 12.

FIGS. 2 and 3 show the temperatures T of the electrical energy storage system (EE) 14, the power electronics (LE) 16 and the electrical machine (EM) 18, each marked on the side as T(14), T(16) and T(18).

The examples in FIGS. 2 and 3 differ in the way in which the relative temperature control was carried out.

In the example shown in FIG. 2, the focus was on the fact that the electrical machine (EM) 18 is in its optimum temperature range $B_O$ as quickly as possible. Such a result occurs, for example, if no bypasses 30, 32, 34 are provided or they are not used. As a result, the electrical machine (EM) 18 can output a peak power of 100 KW due to temperature, while the electrical energy storage system (EE) 14 can only deliver a peak power of 75 KW and the power electronics (LE) 16 can deliver an output of 90 KW. This results in a maximum peak power of the system of 75 KW, which is limited by the currently lowest peak power of the electrical energy storage system (RE) 14.

In the example shown in FIG. 3, the relative temperature control was performed with optimized performance as per the invention. It is true that it was taken into account that the electrical machine (EM) 18 takes on a temperature that can only be found in the preferred temperature range above the optimal temperature range. However, the power electronics (LE) 16 were brought into their optimum temperature range and the electrical energy storage system (EE) 14 into a preferred temperature range, resulting in a peak power of 85 KW for the electrical energy storage system (RE) 14 and a peak power of 95 KW for the power electronics (LE) 16. This results in a maximum peak power of the system of 85 KW, which is limited by the currently lowest peak power of the electrical energy storage system (RE) 14 but is 10 KW higher than in the example shown in FIG. 2. The currently available system performance is therefore higher in the example visualized in FIG. 3 than in the one shown in FIG. 2.

The result shown in FIG. 3 can be achieved or, alternatively, accelerated, by initial activation of all bypasses 30, 32, 34, by providing an active heater which can bring the drive system components 12 into a preferred temperature range $T_B$ or into the optimal temperature range $T_O$ as quickly as possible.

The features of the invention disclosed in the present description, in the drawings and in the claims may be essential either individually or in any combination for the realization of the invention in its various embodiments. The invention can be varied within the framework of the claims and taking into account the knowledge of the competent professional.

In particular, it is pointed out that the invention is not limited to the tempering medium circuit 20 with serial switching of the drive system components 12. It is also possible to operate two or more tempering medium circuits 20 and/or to connect the drive system components 12 in parallel by using other temperature control systems in order to realize an electric drive system 10 according to the invention and/or to carry out the method according to the invention.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An electric drive system of a motor vehicle comprising:
at least one electric energy storage system;
at least one power electronics; and
at least one electrical machine to drive at least one drive wheel of the motor vehicle,
wherein the at least one electrical energy storage system, the at least one power electronics and the at least one electrical machine each constitute a drive system component of the electric drive system and are functionally coupled with each other,
wherein at least two of the drive system components are part of an optimization module, which is configured to perform a performance-optimized relative temperature control of the at least two drive system components,
wherein the optimization module has at least two temperature detection units and at least one switching device coupled to a temperature control device in order to operate the at least one switching device as needed depending on actual temperature values recorded by the at least two temperature detection units, and
wherein, in the performance-optimized relative temperature control of the optimization module, a current performance of the at least two drive system components is determined in dependence on a current component temperature, a currently deliverable power of the at least two drive system components is compared in order to determine which of the at least two drive system components delivers the lowest power, and a temperature of the drive system component that delivers the lowest power is controlled.

2. The electric drive system according to claim 1, wherein each type of drive system component has a respective, separately controllable temperature control device.

3. The electric drive system according to claim 1, wherein the at least two drive system components are functionally coupled with a common temperature control device.

4. The electric drive system according to claim 1, wherein each of the at least two of the drive system components is provided with a respective bypass, wherein, via the at least one switching device, each bypass is brought into an open or closed configuration as needed.

5. The electric drive system according to claim 1, wherein at least one active cooler and/or at least one active heater is provided.

6. The electric drive system according to claim 1, wherein at least one additional tempering medium is provided.

7. A method for controlling a temperature of at least two drive system components comprising an electrical energy storage system, power electronics, and an electrical machine for driving at least one drive wheel of a motor vehicle, which are part of an optimization module of an electric drive system of the motor vehicle, the method comprising:

determining a current performance of the at least two drive system components in dependence on a current component temperature;

comparing a currently deliverable power of the at least two drive system components in order to determine which of the at least two drive system components delivers the lowest power; and controlling a temperature of the drive system component that was determined in the comparison step, and continuous or discontinuous repeating the step of determining.

8. The method according to claim 7, wherein, instead of the step of comparing or before the step of comparing, checking whether a drive system component or several drive system components are able to currently only deliver power below a specified temperature-dependent limit value and if this is true, all the drive system components are temperature-controlled.

9. The method according to claim 7, wherein, in the optimization module there is a map with operating points and associated control commands in order to initiate a relative temperature control of the drive system components triggered by predetermined control commands in dependence on determined operating points of the drive system component.

* * * * *